United States Patent [19]

Arima

[11] Patent Number: 5,741,622
[45] Date of Patent: Apr. 21, 1998

[54] ONE-PACKAGE PHOTOSOLDER RESIST COMPOSITION DEVELOPABLE WITH AQUEOUS ALKALI SOLUTION AND METHOD FOR PRODUCTION OF PRINTED CIRCUIT BOARD BY USE THEREOF

[75] Inventor: Masao Arima, Sakado, Japan

[73] Assignee: Taiyo Ink Manufacturing Co., Ltd., Japan

[21] Appl. No.: 658,626

[22] Filed: Jun. 5, 1996

[30] Foreign Application Priority Data

Jun. 6, 1995  [JP]  Japan ................................. 7-161548

[51] Int. Cl.$^6$ ....................... G03C 1/725; G03C 1/73; G03C 5/00
[52] U.S. Cl. .................. 430/270.1; 430/170; 430/280.1; 430/285.1; 430/311
[58] Field of Search ............................ 430/286.1, 287.1, 430/280.1, 170, 311, 270.1

[56] References Cited

U.S. PATENT DOCUMENTS

| | | | |
|---|---|---|---|
| 3,825,430 | 7/1974 | Kurka | 96/115 R |
| 4,304,923 | 12/1981 | Rousseau | 560/26 |
| 4,544,622 | 10/1985 | Kausch | 430/278 |
| 4,826,753 | 5/1989 | Higashi et al. | 430/281 |
| 4,925,773 | 5/1990 | Miyamura et al. | 430/285 |
| 5,009,982 | 4/1991 | Kamayachi et al. | |
| 5,055,378 | 10/1991 | Miyamura et al. | 430/280 |
| 5,153,102 | 10/1992 | Lee et al. | 430/284 |
| 5,268,255 | 12/1993 | Kikuchi et al. | 430/280 |

FOREIGN PATENT DOCUMENTS

| | | |
|---|---|---|
| 60-103343A | 6/1985 | Japan . |
| 61-243869 | 10/1986 | Japan . |
| 3-253093 | 11/1991 | Japan . |
| 2 253 629 | 9/1992 | United Kingdom . |

*Primary Examiner*—Janet C. Baxter
*Assistant Examiner*—Rosemary Ashton
*Attorney, Agent, or Firm*—Ronald P. Kananen

[57] ABSTRACT

A one-package type photosolder resist developable with an aqueous alkali solution and suitable for use as a solder resist for a printed circuit board is disclosed. The composition comprises (A) a copolymeric macromolecular compound containing at least one free carboxyl group in the molecular unit thereof or (A') a copolymeric macromolecular compound containing at least one free carboxyl group and at least one photoreactive unsaturated group in the molecular unit thereof and assuming a solid state at normal room temperature, (B) a diluent including a polyfunctional unsaturated compound assuming a liquid state at normal room temperature and/or an organic solvent, (C) a photopolymerization initiator, (D) a vinyltriazine compound or a derivative thereof, and (E) an inorganic filler. A process for forming a solder resist on a printed circuit board having a circuit preparatorily formed thereon comprises the steps of applying to the surface of said printed circuit board the one-package type photosolder resist composition mentioned above, drying the applied layer of said composition, selectively exposing the dried layer to actinic radiation according to a prescribed pattern, developing the unexposed area of said layer with an aqueous alkali solution thereby forming a solder resist pattern, and finally curing said resist pattern by exposure to actinic radiation.

40 Claims, No Drawings

5,741,622

ONE-PACKAGE PHOTOSOLDER RESIST COMPOSITION DEVELOPABLE WITH AQUEOUS ALKALI SOLUTION AND METHOD FOR PRODUCTION OF PRINTED CIRCUIT BOARD BY USE THEREOF

BACKGROUND OF THE INVENTION

1. Field of the Invention

This invention relates to a one-package type photosolder resist composition which can be developed with an aqueous alkali solution and more particularly relates to a liquid solder resist composition which is suitable for use as a permanent mask for a printed circuit board and capable of forming a solder resist film excellent in resistance to heat, fastness of adhesion, resistance to electroless plating, and electrical properties by means of a procedure comprising the steps of selectively exposing a coating film of the composition to light, developing the exposed film with an aqueous alkali solution to remove the unexposed areas of the film, thereby forming an image on the film, and finally curing the film by exposure to an active energy ray or actinic radiation. This invention relates further to a method for effecting production of a printed circuit board by the use of the composition mentioned above in the formation of a solder resist pattern.

2. Description of the Prior Art

At present, as the solder resist for part of the household grade printed circuit boards and for virtually all the industrial grade printed circuit boards, a liquid developing type solder resist which is exposed to light and developed to form an image and then finally cured (finish curing) by exposure to heat and light is adopted from the viewpoint of ensuring highly accurate formation of circuits with high density. Further, with due respect to the problem of environmental safety, the liquid solder resist of the type which implements development with a dilute aqueous alkali solution as a developer (hereinafter referred to as "alkali developing type") has come to play the leading role. As such alkali developing type solder resists, published Japanese Patent Application, KOKAI (Early Publication) No. (hereinafter referred to briefly as "JP-A-") 61-243,869 discloses a solder resist composition comprising a photosensitive resin obtained by addition of an acid anhydride to the reaction product of a novolak type epoxy compound with an unsaturated monobasic acid, a photopolymerization initiator, a diluent, and an epoxy compound, JP-A-3-253,093 discloses a solder resist composition comprising a photosensitive resin obtained by addition of an acid anhydride to the reaction product of a novolak type epoxy compound with an unsaturated monobasic acid, a photopolymerization initiator, a diluent, vinyltriazine or a mixture of vinyltriazine with dicyan diamide, and a melamine resin, and GB 2,253,629 A discloses a one-component type solder resist composition comprising a photosensitive resin obtained by addition of an alicyclic dibasic acid anhydride resulting from the reaction of a diolefin with maleic anhydride to the reaction product of a novolak type epoxy compound with an unsaturated monobasic acid, a photopolymerization initiator, a diluent, and a vinyltriazine compound as a thermosetting promoter, for example.

Most liquid alkali developing type solder resists currently available in the market are two-package type solder resists which each consist of a main agent containing a photosensitive resin obtained by addition of an acid anhydride to the reaction product of a novolak type epoxy compound with an unsaturated monobasic acid, a photopolymerization initiator, etc. as main components thereof and a hardener containing a diluent and an epoxy compound as main components thereof. They do not fully manifest their characteristics unless they are put to use after the main agent and the hardener have been thoroughly mixed. The compositions resulting from the mixture have short durations of pot life ranging from several hours to one day. They further have many operational problems such as inducing defective development due to the gradual reaction between the carboxyl group contained in the photosensitive resin of the main agent and the epoxy group of the epoxy compound in the hardener during the interval between the drying step and the developing step. The solder resist which uses a melamine resin has a long service life as compared with the epoxy resin-containing solder resist. It entrains operational problems such as caused by the two-package system and ready absorption of moisture from the ambient air during the interval between the drying step and the exposing step, which results in poor finger-touch dryness of the coating film. Further, since the uncured melamine resin has high hydrophilicity, the resist has the possibility that the liquid developer will permeate even the exposed film at the developing step and the finally cured film will suffer persistence therein of an ionic impurity.

In contrast, as a one-package type photosolder resist, GB 2,253,629 A mentioned above discloses a composition comprising a photosensitive resin obtained by addition of an alicyclic dibasic acid anhydride to the reaction product of a novolak type epoxy compound with an unsaturated monobasic acid, a photopolymerization initiator, a diluent, and a vinyltriazine compound. Since this photosolder resist uses the vinyltriazine compound as a thermosetting promoter, it requires to be thermally cured at such a high temperature as 150° C. after the exposing step and the developing step for the sake of perfectly fulfilling the characteristics of solder resist. It, therefore, can no longer cope with the recent quickly growing trend of printed circuit boards toward assuming the form of thin films and fixing the component elements thereon by means of surface mount technology. To be specific, when the thin-film substrate is heat-treated at such a high temperature as 150° C., it warps to a point where the surface mounting of component elements will become unattainable.

SUMMARY OF THE INVENTION

An object of the present invention, therefore, is to provide a one-package type liquid photosolder resist composition developable with an aqueous alkali solution, which is free from such defects as mentioned above, excellent in storage stability as a one-package preparation and workability at the step of forming a solder resist, capable of producing a cured film possessed of various properties appropriate for a solder resist such as resistance to heat, fastness of adhesion, resistance to electroless plating, and electrical properties, and devoid of the necessity for a step of heating at high temperatures and consequently capable of coping with the trend of printed circuit boards toward assuming the form of thin films and fixing the component elements thereon by means of surface mount technology.

Another object of the present invention is to provide a method for allowing mass production of printed circuit boards with high operational efficiency, which is capable of forming a cured film excellent in such various properties as mentioned above solely by means of exposure to an active energy ray subsequently to the steps of exposure and development, devoid of necessity for the heretofore indispensable step of heating at high temperatures, and consequently capable of coping with the trend of printed circuit boards toward assuming the form of thin films and fixing the component elements thereon by means of surface mount technology.

To accomplish the objects mentioned above, one aspect of the present invention consists in providing a one-package type photosolder resist composition which can be developed with an aqueous alkali solution. The composition according to the first embodiment of the present invention comprises (A) a copolymeric macromolecular compound containing at least one free carboxyl group in the molecular unit thereof, (B) a diluent including a polyfunctional unsaturated compound which is in a liquid state at room temperature and an organic solvent, (C) a photopolymerization initiator, (D) a vinyltriazine compound or a derivative thereof, and (E) an inorganic filler as essential components thereof. The composition according to the second embodiment of the present invention comprises (A') a copolymeric macromolecular compound containing at least one free carboxyl group and at least one photoreactive unsaturated group together in the molecular unit thereof and assuming a solid state at room temperature, (B) a polyfunctional unsaturated compound which is in a liquid state at room temperature and/or an organic solvent as a diluent, (C) a photopolymerization initiator, (D) a vinyltriazine compound or a derivative thereof, and (E) an inorganic filler as essential components thereof.

Another aspect of the present invention consists in providing a method for the production of a printed circuit board including a process of forming a solder resist in a prescribed pattern on a printed circuit board having a circuit preparatorily formed thereon, which process is characterized by the steps of applying to the surface of the printed circuit board having a circuit already formed thereon the aforementioned one-package type photosolder resist composition developable with an aqueous alkali solution, drying the applied layer of the composition, then selectively exposing the dried layer to light according to a prescribed pattern by projecting such an active energy ray as a laser beam directly on the layer according to the pattern or by exposing the layer to actinic radiation through a photomask having a light-permeable area formed in conformity with the pattern, developing the unexposed area of the layer with an aqueous alkali solution thereby forming a resist pattern, and thereafter finally curing the resist film by exposure to an active energy ray or actinic radiation.

DETAILED DESCRIPTION OF THE INVENTION

The present inventor, after continuing a diligent study in search of a method for solving the problems mentioned above, has made a finding that a liquid solder resist composition which has the reactive group of a film-forming ingredient thereof limited exclusively to a photopolymerizable unsaturated group [a polyfunctional unsaturated compound (B) in the first embodiment, or a copolymeric macromolecular compound (A') or additionally a polyfunctional unsaturated compound (B) in the second embodiment] and adopts a copolymeric macromolecular compound as a main resin and uses these components in combination with a vinyltriazine compound or a derivative thereof (D) and an inorganic filler (E) is developable with an aqueous alkali solution and, at the same time, excellent in storage stability as a one-package preparation, and capable of forming a coat completely curable solely by exposure to actinic radiation subsequently to the exposing and developing steps and therefore allowing highly efficient mass production of resist films excellent in various properties such as resistance to heat, fastness of adhesion, resistance to electroless plating, electrical insulating properties, and resistance to electrolytic corrosion.

Specifically, the liquid photosolder resist composition of the present invention is characterized in the first place by having the reactive group of a film-forming ingredient thereof exclusively limited to an unsaturated group for the purpose of accomplishing the object of obtaining the composition in the form of a one-package preparation instead of adopting a thermoreactive epoxy resin or melamine resin which has been heretofore used. The unsaturated group such as, for example, an unsaturated double bond allows the composition to undergo a reaction readily on being exposed to light in the presence of a photopolymerization initiator. In order for the reaction to be initiated thermally, however, the composition requires a temperature of not lower than 170° C. The composition that contains the film-forming ingredient answering the description given above enjoys good storage stability and fulfills one of the objects of the present invention, namely the production of the composition as a one-package preparation. As a result, the coating film of the composition can be completely cured solely by exposure to actinic radiation and is enabled to obviate the necessity for a step of heating at high temperatures.

A cured film that is formed by the photopolymerization reaction solely of an unsaturated group, however, is too hard and brittle to acquire such properties as ample fastness of adhesion and resistance to the heat of soldering which are generally required of a solder resist. The inventor, on the belief that the problem arises from the fact that the shrinkage due to curing during the reaction of the unsaturated group is large as compared with that of the epoxy group, has overcome this problem by taking the following measures based on the result of his study.

The liquid photosolder resist composition of the present invention is characterized in the second place by adopting an inorganic filler as an essential component thereof and using this filler in a relatively large amount for the purpose of diminishing such shrinkage due to curing as mentioned above. Appropriately, the amount of the inorganic filler to be incorporated in the composition is in the range of 150 to 600 parts by weight, preferably 200 to 400 parts by weight, based on 100 parts by weight of the solids of the copolymeric macromolecular compound (A or A'). By particularly incorporating the inorganic filler in an amount of not less than 150 parts by weight, the composition acquires markedly improved resistance to electroless plating and the produced photocurable resin composition exhibits improvement in sensitivity and finger-touch dryness.

If the amount of the inorganic filler to be incorporated is less than 150 parts by weight, the filler will not be fully effective in repressing the shrinkage due to curing and the formed solder resist will be deficient in fastness of adhesion and resistance to the heat of soldering. Conversely, if this amount exceeds 600 parts by weight, the composition will not easily assume a pasty state and the produced coating film will exhibit unduly low resistance to chemicals and suffer persistence therein of an undeveloped part.

Then, the third characteristic resides in using a vinyltriazine compound or a derivative thereof for the purpose of imparting improved fastness of adhesion to the produced coating film. The vinyltriazine compounds or derivatives thereof which are usable herein for this purpose include such unsaturated double bond-containing basic compounds as 2-vinyl- 4,6-diamino-S-triazine, 2,4-diamino-6-methacryloyloxyethyl-S-triazine, adduct of 2-vinyl-4,6- diamino-S-triazine with isocyanuric acid, and adduct of 2,4-diamino-6-methacryloyloxyethyl-S-triazine with isocyanuric acid, for example. Owing to the basicity thereof coupled with the effect thereof in chelating with the copper foil on the printed circuit board and the reactivity of the unsaturated group thereof, the vinyltriazine compound or derivative thereof can enhance the fastness of adhesion between the coating film and the copper foil. To be specific, the two amino groups of the compound are chelated with the copper (Cu) foil of the printed circuit board and the unsaturated double bond, on exposure to the active energy ray, is caused to react as with the unsaturated double bond or the carboxyl group of the film-forming ingredient. It is believed that the vinyltriazine compound exalts the fastness of adhesion between the copper foil and the film-forming ingredient by coupling the copper foil with the film-forming ingredient as described above.

Then, the fourth characteristic resides in using a copolymeric macromolecular compound as a main resin incorporating therein a carboxyl group for the purpose of enabling the produced composition to be developed with an aqueous alkali solution.

As the carboxyl group-containing resin which is intended to impart developability with an aqueous alkali solution to the composition, the copolymeric macromolecular compound permits easy addition to the molecular weight, easy incorporation of a heat-resistant backbone, and easy introduction of a flexible substituent as compared with the photosensitive resin which is used in the conventional alkali developing type photosolder resist and which contains an unsaturated group and a carboxyl group together and results from addition of a dibasic acid anhydride to an acrylate of cresol or phenol novolak type epoxy resin. The coating film consequently obtained from the composition containing the former resin enjoys improved resistance to heat, exalted flexibility, and diminished shrinkage due to curing.

The carboxyl group-containing resin which is intended to impart developability with an aqueous alkali solution to the composition is not always required to contain an unsaturated group in manifesting its effect fully satisfactorily. It is enabled to acquire a fully satisfactory photocurability owing to the presence of a polyfunctional unsaturated compound which, incorporated as a diluent, assumes a liquid state at normal room temperature or preferably in consequence of separate addition of a polyfunctional unsaturated group-containing compound assuming a solid or semi-solid state at normal room temperature.

The one-package type photosolder resist composition of the present invention developable with an aqueous alkali solution, particularly the composition of the first embodiment of the present invention is preferably characterized by using a polyfunctional unsaturated group-containing compound which is solid or semisolid at normal room temperature for the purpose of establishing good contrast between the degree of curing during the image formation and the rigidity attained by the final curing. Owing to the use of this compound, satisfactory results are obtained in both the photocuring property and the properties of the cured film.

Now, the components of the one-package type photosolder resist composition of the present invention will be described in detail below.

First, (A) the copolymeric macromolecular compound containing at least one free carboxyl group in the molecular unit thereof or (A') the copolymeric macromolecular compound containing at least one free carboxyl group and at least one photoreactive unsaturated group together in the molecular unit thereof which is used in the present invention appropriately has an acid value in the range of 30 to 200 mg KOH/g. If the acid value is less than 30 mg KOH/g, the produced composition will be deficient in solubility in an aqueous alkali solution and will not be easily developed with the aqueous alkali solution. Conversely, if the acid value exceeds 200 mg KOH/g, the produced coating film will be developed even in the surface of the exposed part without reference to the conditions of the exposure.

As a concrete example of (A) the copolymeric macromolecular compound mentioned above, (a) a carboxyl group-containing resin formed of a copolymer of a molecular weight in the range of 5,000 to 60,000 obtained by radically or anionically polymerizing an unsaturated monobasic acid with at least one compound containing one unsaturated group in the molecular unit thereof may be cited. Though this resin does not particularly possess a photoreactive group, it is allowed to have a larger molecular weight than the other resins because it has a high softening point, an excellent finger-touch dryness, and good developability as compared with the other resins. Owing to the advantage in terms of molecular weight, this resin acquires a film-forming property and a resistance to heat. If the molecular weight is less than 5,000, the resin will be deficient in resistance to the heat of soldering. Conversely, if the molecular weight exceeds 60,000, the produced composition will be deficient in developability. The same remarks hold good for the following resins.

As concrete examples of (A') the copolymeric macromolecular compound mentioned above, (b) a carboxyl group-containing photosensitive resin produced by causing (b-1) a copolymer of a molecular weight in the range of 5,000 to 60,000 obtained by radically or anionically polymerizing an unsaturated monobasic acid with at least one compound containing one unsaturated group in the molecular unit thereof, i.e. copolymer (a) mentioned above, and (b-2) a compound containing one epoxy group and one unsaturated group together in the molecular unit thereof to induce an addition reaction between the free carboxyl group of the copolymer (b-1) and the epoxy group of the compound (b-2) to such an extent that the final product may assume an acid value in the range of 30 to 200 mg KOH/g and (c) a carboxyl group-containing photosensitive resin produced by causing (c-1) an unsaturated monobasic acid to react with an epoxy group in a side chain of (c-2) a copolymer of a molecular weight in the range of 5,000 to 60,000 obtained by radically or anionically polymerizing (c-2-1) a compound containing one epoxy group and one unsaturated group together in the molecular unit thereof and (c-2-2) at least one compound containing one unsaturated group in the molecular unit thereof and then causing the secondary hydroxyl group of the reaction product produced in the reaction mentioned above and (c-3) a dibasic acid anhydride to induce an addition reaction to such an extent that the final product may assume an acid value in the range of 30 to 200 mg KOH/g may be cited.

The carboxyl group-containing photosensitive resin (b) mentioned above is endowed with the film-forming property due to the advantage in terms of molecular weight, the reactivity of the unsaturated group, and the developability ascribable to the free carboxylic group. The carboxyl group-containing photosensitive resin (c) mentioned above is vested with the film-forming property due to the advantage in terms of molecular weight, the reactivity of the unsaturated group, and the developability owing to the free carboxylic group produced during the reaction between the hydroxyl group and the dibasic acid anhydride.

As typical examples of the unsaturate monobasic acid to be used in the preparation of the carboxyl group-containing resins (a to c) mentioned above, acrylic acid; methacrylic acid; or unsaturated dibasic acid anhydride adducts of hydroxyl group-containing acrylates such as hydroxyethyl (meth)acrylates, hydroxypropyl (meth)acrylates, hydroxybutyl (meth)acrylates, trimethylolpropane di(meth) acrylates, pentaerythritol tri(meth)acrylates, dipentaerythritol penta(meth)acrylates, phenylglycidyl ether (meth) acrylates, and (meth)acrylic acid-caprolactone adducts may be cited.

As concrete examples of the dibasic acid anhydride mentioned above, phthalic anhydride, methyltetrahydrophthalic anhydride, tetrahydrophthalic anhydride, hexahydrophthalic anhydride, methylhexahydrophthalic anhydride, succinic anhydride, maleic anhydride, itaconic anhydride, and nadic anhydride may be cited.

As concrete examples of the compound containing one unsaturated group in the molecular unit thereof, vinyl compounds such as styrene, substituted styrenes, and vinyl acetate; alkyl (meth)acrylates such as methyl (meth) acrylates, ethyl (meth)acrylates, lauryl (meth)acrylates, isopropyl (meth)acrylates, and t-butyl (meth)acrylates; acrylic esters such as 2-ethylhexyl (meth)acrylates, cyclohexyl (meth)acrylates, isobornyl (meth)acrylates, benzyl (meth) acrylates, phenyl (meth)acrylates, hydroxyethyl (meth) acrylates, hydroxypropyl (meth)acrylates, hydroxybutyl (meth)acrylates, and phenylglycidyl ether (meth)acrylates; and maleimides such as N-phenyl maleimide and N-cyclohexyl maleimide may be cited.

As concrete examples of the compound containing one epoxy group and one unsaturated group together in the molecular unit thereof, glycidyl (meth)acrylates, N-[4-(2,3-epoxypropoxy)-3,5-dimethylbenzyl] acrylamide (produced by Kanegafuchi Chemical Industry Co., Ltd. and marketed under trademark designation of "Kaneka Resin AXE"), allyl glycidyl ethers, and (meth)acrylic monomers having an alicyclic epoxy group represented by CYCLOMER® M-100 and A-200 produced by Daicel Chemical Industry Ltd. may be cited.

As the diluent (B) mentioned above, polyfunctional unsaturated compounds which assume a liquid state at normal room temperature and organic solvents are usable. The diluent is used for the purpose of dissolving the macromolecular compound (A or A') mentioned above and adjusting the composition to such a degree of viscosity suitable for a varying method of application. The polyfunctional unsaturated compound which assumes a liquid state at normal room temperature is used for the purpose of exalting the photochemical reactivity of the composition and aiding in enhancing the solubility of the composition in an aqueous alkali solution. It is, therefore, used appropriately in an amount of not less than 5 parts by weight based on 100 parts by weight of the macromolecular compound (A or A') (as solids). Particularly in the composition of the first embodiment, it is advantageously incorporated in a relatively large amount. When the polyfunctional unsaturated compound assuming a liquid state at normal room temperature is used in a large amount, however, the produced film does not easily acquire necessary finger-touch dryness after drying and tends to have their properties degraded. Properly, therefore, it is used in an amount of not more than 100 parts by weight, preferably not: more than 50 parts by weight, based on 100 parts by weight of the aforementioned macromolecular compound (A or A') (as solids). The organic solvent has no adverse effect on the dried coat so long as it can be dried under prescribed drying conditions. Though the amount of the organic solvent to be used is limited only by the method of application of the composition to a substrate, it is generally proper in the range of 5 to 300 parts by weight.

As the polyfunctional unsaturated compound which is in a liquid state at room temperature, hydroxyl group-containing acrylates such as 2-hydroxyethyl acrylate, 2-hydroxy-propyl acrylate, pentaerythritol triacrylate, and dipentaerythritol pentaacrylate; acrylamide and derivatives thereof such as N-methylol acrylamide; water-soluble acrylates such as polyethylene glycol diacrylate and polypropylene glycol diacrylate; polyfunctional acrylates such as trimethylol propanetriacrylate, pentaerythritol tetraacrylate, and dipentaerythritol hexaacrylate; and methacrylates corresponding to the acrylates enumerated above may be cited. These compounds may be used either singly or in combination of two or more members.

Examples of the organic solvents include, but are not limited to: ketones, cellosolves, carbitols, cellosolve acetates, carbitol acetates, propylene glycol ethers, dipropylene glycol ethers, propylene glycol ether acetates, dipropylene glycol ether acetates, and aromatic hydrocarbons. The organic solvents may be used either singly or in the form of a mixture of two or more members.

Examples of the photopolymerization initiators (C) include, but are not limited to: benzoin and alkyl ethers thereof such as benzoin, benzoin methyl ether, benzoin ethyl ether, and benzoin isopropyl ether; acetophenones such as acetophenone, 2,2-dimethoxy-2-phenyl acetophenone, 2,2-diethoxy-2-phenyl acetophenone, and 1,1-dichloroacetophenone; aminoacetophenones such as 2-methyl-1-[4-(methylthio)phenyl]-2-morpholinoaminopropanone-1,2-benzyl-2-dimethylamino-1-(4-morpholinophenyl)-butanone- 1, and N,N-dimethylaminoacetophenone; anthraquinones such as 2-methyl anthraquinone, 2-ethylanthraquinone, 2-tert-butyl anthraquinone, and 1-chloro-anthraquinone; thioxanthones such as 2,4-dimethylthioxanthone, 2,4-diethylthioxanthone, 2-chlorothioxanthone, and 2,4-diisopropylthioxanthone; ketals such as acetophenone dimethyl ketal and benzyl dimethyl ketal; benzophenones such as benzophenone and 4,4'-bis(diethylamino)benzophenone; xanthones; and 2,4,6-trimethylbenzoyl diphenyl phosphine oxide. These well known and widely used photopolymerization initiators may be used either singly or in the form of a combination of two or more members. Optionally such a photopolymerization initiator may be used in combination with photopolymerization accelerators such as ethyl dimethylaminobenzoate and the tertiary amine like triethanolamine. The amount of the photopolymerization initiator to be used suitably falls in the range of 0.5 to 20 parts by weight, based on 100 parts by weight of the macromolecular compound (A or A')(as solids) mentioned above.

The aforementioned vinyltriazine compounds or derivatives thereof (D) mentioned above may be used either singly or in the form of a mixture of two or more members. The concrete examples include 2-vinyl-4,6-diamino-S-triazine, 2,4-diamino-6-methacryloyloxyethyl-S-triazine, adduct of 2-vinyl-4,6-diamino-S-triazine with isocyanuric acid, and adduct of 2,4-diamino-6-methacryloyloxyethyl-S-triazine with isocyanuric acid, for example. The vinyltriazine compound or a derivative thereof is used for the purpose of exalting the fastness of adhesion to copper on a substrate and consequently improving the cured film in resistance to heat and resistance to electroless plating. Properly, the amount of the compound to be incorporated in the composition is in the range of 0.1 to 10 parts by weight, based on 100 parts by weight of the aforementioned macromolecular compound (A or A′) (as solids). If this amount is less than 0.1 part by weight, the compound will manifest virtually no effect in imparting fastness of adhesion. Conversely, if the amount exceeds 10 parts by weight, the composition will be deficient in stabilone as a one-package preparation and the cured film will be deficient in durability.

Examples of the inorganic filler (E) mentioned above include, but are not limited to: barium sulfate, barium titanate, silicon oxide powder, finely divided powder of silicon oxide, amorphous silica, talc, clay, magnesium carbonate, calcium carbonate, aluminum oxide, aluminum hydroxide, and mica. These well known and widely used inorganic filler may be used either singly or in the form of a mixture of two or more members. The inorganic filler is used for the purpose of repressing the shrinkage of a coating film due to curing and improving such properties as fastness of adhesion and hardness. The amount of the inorganic filler to be incorporated in the composition has already been explained hereinbefore.

The composition of the present invention, when necessary for the purpose of improving the photocurability, resistance to heat, and resistance to chemicals, may additionally incorporate. therein one member or a mixture of two or more members of polyfunctional unsaturated group-containing compounds assuming a solid state or a semisolid state at normal room temperature, for example, epoxy (meth) acrylates such as reaction products of cresol or phenol novolak type epoxy compounds with unsaturated monobasic acids and reaction products of unsaturated monobasic acids with copolymers of a compound containing one epoxy group and one unsaturated group together in the molecular unit thereof and at least one compound containing one unsaturated group in the molecular unit thereof. Here, as the unsaturated monobasic acid, the compound containing one epoxy group and one unsaturated group together in the molecular unit thereof, and the compound containing one unsaturated group in the molecular unit thereof, those already mentioned above are usable.

Further, the composition of the present invention may incorporate therein, as occasion demands, a well known and widely used color pigment such as phthalocyanine green, phthalocyanine blue, disazo yellow, crystal violet, titanium dioxide, and carbon black; a well known and widely used thixotropic agent such as organo-bentonite, bentonite, and montmorillonite; a well known and widely used silicone type, fluorocarbon type, or macromolecular type anti-foaming agent; and a leveling agent.

The liquid solder resist composition of the present invention having such a composition as described above is adjusted to a level of viscosity suitable for a particular coating method by dilution when necessary, then applied by the technique of screen printing, curtain coating, spray coating, roll coating, or the like to a printed circuit board having a circuit preparatorily formed thereon, and then dried in a drying oven such as a far infrared rays drying oven and a hot air drying oven at a temperature in the range of 60° to 100° C., for example, to expel by evaporation the organic solvent contained in the composition to produce a tuckfree coating film. The coating film is then exposed to a laser beam by projecting the laser beam directly on the coating film according to a prescribed pattern or selectively exposed to actinic radiation through a photomask having a prescribed exposure pattern and the unexposed area of the coating film is developed with an aqueous alkali solution to form a resist pattern. The dosage of the active energy ray for the formation of the resist pattern is appropriately in the range of 30 to 1,000 mJ/cm$^2$, preferably 30 to 300 mJ/cm$^2$. The resist film formed in the prescribed pattern as described above is finally cured by being further irradiated with the active energy ray to give birth to a solder resist film which excels in fastness of adhesion, hardness, resistance to the heat of soldering, resistance to chemicals, resistance to solvents, electrical insulating properties, resistance to electrolytic corrosion, and resistance to plating. The appropriate dosage of the active energy ray for the final curing is in the range of 300 to 5,000 mJ/cm$^2$, preferably 300 to 3,000 mJ/cm$^2$. So long as the liquid solder resist composition of the present invention contains the polyfunctional unsaturated group-containing compound assuming a solid or semisolid state at normal room temperature, it produces a solder resist film excelling in fastness of adhesion, hardness, resistance to the heat of soldering, resistance to chemicals, resistance to solvents, electrical insulating properties, and resistance to plating even when the final curing is effected by application of heat subsequently to the steps of exposure and development.

As an aqueous alkali solution to be used in the process of development mentioned above, aqueous alkali solutions of potassium hydroxide, sodium hydroxide, sodium carbonate, potassium carbonate, sodium phosphate, sodium silicate, ammonia, amines, etc. can be used.

Examples of light sources which are advantageously used for the purpose of photocuring the composition include low-pressure mercury vapor lamp, medium-pressure mercury vapor lamp, high-pressure mercury vapor lamp, ultra-high-pressure mercury vapor lamp, xenon lamp, and metal halide lamp, for example. Also, a laser beam may be used as the actinic radiation.

The method of the present invention for the production of a printed circuit board enables a cured film excelling in such various properties as enumerated above to be obtained exclusively by exposure to the active energy ray subsequently to the steps of exposure and development, obviates the necessity for the heretofore indispensable step of heating at high temperatures, and permits operationally efficient mass-production of printed circuit boards capable of coping with the trend of printed circuit boards toward assuming the form of thin films and fixing the component elements thereon by means of surface mount technology.

Now, the present invention will be more specifically described below with reference to working examples. Wherever "parts" and "%" are mentioned hereinbelow, they invariably refer to those based on weight unless otherwise specified.

SYNTHETIC EXAMPLE 1

In a flask equipped with a thermometer, a stirrer, a dropping funnel, and a reflux condenser, methyl methacrylate, ethyl methacrylate, phenyl glycidyl methacrylate, and methacrylic acid were charged at a molar ratio of 2:2:3:3 and, in the presence of dipropylene glycol monomethyl ether and azobis-isobutyronitrile (hereinafter referred to briefly as "AIBN") added thereto respectively as a solvent and a catalyst, were stirred in an atmosphere of nitrogen at 80° C. for 4 hours to obtain a resin solution. The photosensitive resin containing carboxyl groups which was consequently obtained was found to have a nonvolatile content of 65%, an acid value of 120 mg KOH/g as solids, and a weight average molecular weight of 25,000. This reaction solution will be referred to hereinafter as "varnish a".

SYNTHETIC EXAMPLE 2

In a flask equipped with a thermometer, a stirrer, a dropping funnel, and a reflux condenser, methyl methacrylate, ethyl methacrylate, and methacrylic acid were charged at a molar ratio of 1:1:2 and, in the presence of dipropylene glycol monomethyl ether and AIBN added thereto respectively as a solvent and a catalyst, were stirred in an atmosphere of nitrogen at 80° C. for 4 hours to obtain a resin solution.

This resin solution was cooled. The cooled resin solution, in the presence of methyl hydroquinone and tetrabutyl phosphonium bromide added thereto respectively as a polymerization inhibitor and a catalyst, was subjected to an addition reaction with 20 mol % of glycidyl methacrylate under the conditions of 95°–105° C. and 16 hours. The reaction solution was cooled and extracted from the flask. The photosensitive resin containing ethylenically unsaturated bonds and carboxyl groups together which was consequently obtained was found to have a nonvolatile content of 65%, an acid value of 120 mg KOH/g as solids, and a weight average molecular weight of 35,000. This reaction solution will be referred to hereinafter as "varnish b".

SYNTHETIC EXAMPLE 3

In a flask equipped with a thermometer, a stirrer, a dropping funnel, and a reflux condenser, methyl methacrylate and methacrylic acid were charged at a molar ratio of 4:6 and, in the presence of dipropylene glycol monomethyl ether and AIBN added thereto respectively as a solvent and a catalyst, were stirred in an atmosphere of nitrogen at 80° C. for 4 hours to obtain a resin solution.

This resin solution was cooled. The cooled resin solution, in the presence of methyl hydroquinone and tetrabutyl phosphonium bromide added thereto respectively as a polymerization inhibitor and a catalyst, was subjected to an addition reaction with 30 mol % of glycidyl methacrylate under the conditions of 95°–105° C. and 16 hours. The reaction solution was cooled and extracted from the flask. The photosensitive resin containing ethylenically unsaturated bonds and carboxyl groups together which was consequently obtained was found to have a nonvolatile content of 65%, an acid value of 125 mg KOH/g as solids, and a weight average molecular weight of 15,000. This reaction solution will be referred to hereinafter as "varnish b'".

SYNTHETIC EXAMPLE 4

In a flask equipped with a thermometer, a stirrer, a dropping funnel, and a reflux condenser, methyl methacrylate and glycidyl methacrylate were charged at a molar ratio of 4:6 and, in the presence of carbitol acetate and AIBN added thereto respectively as a solvent and a catalyst, were stirred in an atmosphere of nitrogen at 80° C. for 4 hours to obtain a resin solution.

This resin solution was cooled. The cooled resin solution, in the presence of methyl hydroquinone and tetrabutyl phosphonium bromide added thereto respectively as a polymerization inhibitor and a catalyst, was subjected to an addition reaction with acrylic acid at a ratio of 100 mol % of epoxy group thereof under the conditions of 95°–105° C. and 16 hours. The reaction product was cooled to 80°–90° C. and left reacting with tetrahydrophthalic anhydride for 8 hours. The reaction product was cooled and extracted from the flask. The photosensitive resin containing a ethylenically unsaturated bonds and carboxyl groups together which was consequently obtained was found to have a nonvolatile content of 65%, an acid value of 100 mg KOH/g as solids, and a weight average molecular weight of 15,000. The reaction solution will be referred to hereinafter as "varnish c".

Comparative Synthetic Example 1

In a four-necked flask equipped with a stirrer and a reflux condenser, 220 parts of a cresol novolak type epoxy resin (product of Dainippon Ink & Chemicals,Inc., EPICLON ® N-695, epoxy equivalent; 220) and 214 parts of carbitol acetate added thereto were dissolved by heating. The solution was made to add 0.1 part of hydroquinone as a polymerization inhibitor and 2.0 parts of dimethyl benzyl amine as a reaction catalyst. The resultant mixture kept heated to 95°–105° C. and 72 parts of acrylic acid gradually added dropwise thereto were left reacting for 16 hours. The reaction product was cooled to 80°–90° C. and made to add 106 parts of tetrahydrophthalic anhydride and they were left reacting for 8 hours. The product was cooled and then extracted from the flask. The photosensitive resin containing ethylenically unsaturated bonds and carboxyl groups together which was consequently obtained was found to have a nonvolatile content of 65%, an acid value of 100 mg KOH/g as solids, and a weight average molecular weight of 3,500. This reaction solution will be referred to hereinafter as "varnish d".

In the synthetic examples mentioned above, the molecular weights were determined by the use of a high-speed liquid chromatographic device formed by connecting three columns (product of Showa Denko K.K., Shodex® KF-804, KF-803, and KF-802) to a pump (produced by Shimadzu Seisakusho Ltd. and marketed under product code of "LC-6AD").

Examples 1 to 10 and Comparative Examples 1 to 8

The components accounting for varying ratios of combination shown in Tables 1 to 3 and using the varnishes obtained in the synthetic examples mentioned above were severally kneaded with a three-roll mill to obtain photocurable resin compositions. The characteristics of these compositions are additionally shown in Tables 1 to 3.

The characteristics shown in the tables were determined by the following methods.

(1) One-package stability

A sample composition was kept in a thermo-hygrostat at 20° C. for 60 days and tested daily for the magnitude of viscosity exhibited after five rotations of an EHD type viscometer to determine the presence or absence of increase in viscosity. The results of this determination were rated on the following three-point scale.

○: Ratio of increase in viscosity within 120%

Δ: Ratio of increase in viscosity within 200% x: Gelling or ratio of increase in viscosity exceeding 200%

Test for properties:

A sample composition was applied by screen printing to the entire surface of a copper-clad substrate having a prescribed pattern formed preparatorily thereon and the applied layer of the composition was dried at 90° C. for 10 minutes to form a tuck-free coating film. The coating film on the substrate was exposed to light according to a solder resist pattern through a negative film tightly superposed thereon and developed with an aqueous 1% sodium carbonate solution applied by spraying at a pressure of 2 kg/cm² to form a resist pattern thereon.

The substrates obtained of the sample compositions of Examples 1 to 7 and Comparative Examples 1 to 7 were each placed in a UV conveyor furnace and finally cured therein by exposure to an ultraviolet light at a cumulative dose of 1000 mJ/cm² and the substrates obtained of the sample compositions of Examples 8 to 10 and Comparative Example 8 were each post cured by heating at 150° C. for 30 minutes to obtain test substrates.

(2) Resistance to the heat of soldering

A test substrate coated with a rosin type flux was immersed for 5 seconds in a solder bath set in advance at 260° C., washed with a denatured alcohol to remove the flux, and visually examined as to swelling and exfoliation of the resist layer. The result of the examination was rated on the following four-point scale.

⊚: No exfoliation of the coating film observed after at least 6 repetitions of 5 seconds' immersion in the bath ○: No exfoliation of the coating film observed after at least 3 repetitions of 5 seconds' immersion in the bath Δ: Slight exfoliation of the coating film observed after at least 3 repetitions of 5 seconds' immersion in the bath x: Swelling and exfoliation of the coating film observed after one round of 5 seconds' immersion in the bath (3) Fastness of adhesion A sample substrate having 100 cross-cut squares incised therein was subjected to a peel test with a cellophane adhesive tape by the method specified in JIS (Japanese Industrial Standard) D-0202 to determine the degree of separation of the resist layer. The result of this test was rated on the following three-point scale.

○: Absolutely no peeling of the coating film observed

Δ: Only slight peeling of the coating film observed x: Peeling of the coating film observed (4) Resistance to electroless gold plating Sample substrates of each species were plated successively in an electroless nickel plating bath and an electroless gold plating bath, both available in the market, under the conditions of 5 μm of nickel and 0.03 μm of gold. After the plating, the sample substrates were subjected to a tape peeling test to determine whether or not their resist layers were separated and whether or not the resist layers had been infiltrated with the plating medium. The results of the test were rated on the following three-point scale.

○: Absolutely no change observed

Δ: Only slight peeling and infiltration observed x: Peeling of the coating film observed (5) Resistance to electrolytic corrosion Test substrates were manufactured by following the procedure described above while using a comb electrode B coupon of IPC B-25 in the place of the copper-clad substrate. A sample substrate was kept standing in a thermo-hygrostat for 500 hours under the conditions of 40° C. and 90% R.H., with a bias voltage of DC 100V applied to the comb electrode. After the standing in the thermo-hygrostat, the sample substrate was examined to determine whether or not it suffered occurrence of migration. The test result was rated on the following three-point scale.

○: Absolutely no change observed

Δ: Only slight change observed x: Occurrence of migration observed (6) Electrical insulating property Test substrates were manufactured by following the procedure described above while using a comb electrode B coupon of IPC B-25 in the place of the copper-clad substrate. A sample substrate was tested for insulating resistance by application of a bias voltage of DC 500V to the comb electrode.

TABLE 1

(in parts by weight)

| Example No. | Examples | | | Comparative Examples | | | |
| --- | --- | --- | --- | --- | --- | --- | --- |
| | 1 | 2 | 3 | 1 | 2 | 3 | 4 |
| Varnish a | 154 | — | — | — | 154 | — | — |
| Varnish b | — | 154 | — | — | — | 154 | — |
| Varnish c | — | — | 154 | — | — | — | 154 |
| Varnish d | — | — | — | 154 | — | — | — |
| Irgacure 907[1] | 10 | 10 | 10 | 10 | 10 | 10 | 10 |
| TMPTA[2] | 60 | 30 | 20 | 20 | 60 | 20 | 20 |
| Phthalocyanine green | 1 | 1 | 1 | 1 | 1 | 1 | 1 |
| Barium sulfate | 200 | 200 | 200 | 200 | 200 | 200 | 200 |
| Talc | 100 | 100 | 100 | 100 | 100 | 100 | 100 |
| Phenol novolak epoxy acrylate | 80 | 20 | 10 | 10 | 80 | 20 | 10 |
| Carbitol acetate | 30 | 50 | 20 | 50 | 30 | 50 | 20 |
| Vinyltriazine | 2 | 2 | 2 | 2 | — | — | — |
| One-package stability | ○ | ○ | ○ | ○ | ○ | ○ | ○ |
| Resistance to the heat of soldering | ⊚ | ⊚ | ○ | x | x | x | x |
| Fastness of adhesion | ○ | ○ | ○ | ○ | Δ | Δ | Δ |
| Resistance to electroless gold plating | ○ | ○ | ○ | Δ | x | x | x |
| Resistance to electrolytic corrosion | ○ | ○ | ○ | Δ | Δ | Δ | ○ |

Remark
[1] 2-Methyl-1-[4-(methylthio)phenyl]-2-morpholinoaminopropanone-1 (photopolymerization initiator produced by Ciba-Geigy)
[2] Trimethylol propane triacrylate It is clearly noted from Table 1 that the liquid solder resist compositions of Examples 1 to 3 according to the present invention excelled in one-package stability. The cured films of these compositions also excelled in resistance to the heat of soldering, fastness of adhesion, resistance to electroless gold plating, and resistance to electrolytic corrosion. In contrast, the liquid solder resist composition containing a Photosensitive resin produced by addition of an acid anhydride to the epoxy acrylate of cresol novolak type epoxy resin which was obtained in Comparative Example 1 afforded a cured film which was deficient in resistance to the heat of soldering and was not excellent in resistance to electroless gold plating and resistance to electrolytic corrosion. The liquid solder resist compositions using a copolymeric photosensitive resin and not incorporating a vinyltriazine compound (2-vinyl-4,6-diamino-S-triazine) which were obtained in Comparative Examples 2 to 4 afforded cured films which were deficient in resistance to the heat of soldering and resistance to electroless gold plating and were not excellent in fastness of adhesion and resistance to electrolytic corrosion.

TABLE 2

(in parts by weight)

| | Examples | | | | Comparative Examples | | |
|---|---|---|---|---|---|---|---|
| Example No. | 4 | 5 | 6 | 7 | 5 | 6 | 7 |
| Varnish b | 154 | 154 | 154 | 154 | 154 | 154 | 154 |
| Irgacure 907 | 10 | 10 | 10 | 10 | 10 | 10 | 10 |
| TMPTA | 30 | 30 | 30 | 30 | 30 | 30 | 30 |
| Phthalocyanine green | 1 | 1 | 1 | 1 | 1 | 1 | 1 |
| Barium sulfate | 200 | 200 | 200 | 200 | 200 | 200 | 0 |
| Talc | 100 | 100 | 100 | 100 | 100 | 100 | 0 |
| Phenol novolak epoxy acrylate | 20 | 20 | 20 | 0 | 20 | 20 | 20 |
| Carbitol acetate | 50 | 50 | 50 | 50 | 50 | 50 | 50 |
| Vinyltriazine | — | — | — | 2 | — | — | 2 |
| MAVT[1] | 2 | — | — | — | — | — | — |
| VT-OK[2] | — | 2 | — | — | — | — | — |
| MAVT-OK[3] | — | — | 2 | — | — | — | — |
| Dicyandiamide | — | — | — | — | 2 | — | — |
| 2-Methyl imidazole | — | — | — | — | — | 2 | — |
| One-package stability | ○ | ○ | ○ | ○ | ○ | ○ | ○ |
| Resistance to the heat of soldering | ◉ | ○ | ○ | ○ | × | × | × |
| Fastness of adhesion | ○ | ○ | ○ | ○ | △ | ○ | × |
| Resistance to electroless gold plating | ○ | ○ | ○ | ○ | × | × | × |
| Resistance to electrolytic corrosion | ○ | ○ | ○ | ○ | ○ | △ | ○ |
| Electrical insulating property | $10^{13}$ Ω | $10^{13}$ Ω | $10^{13}$ Ω | $10^{13}$ Ω | $10^{13}$ Ω | $10^{12}$ Ω | $10^{13}$ Ω |

Remark
[1] 2,4-Diamino-6-methacryloyloxyethyl-S-triazine
[2] Adduct of 2-vinyl-4,6-diamino-S-triazine with isocyanuric acid
[3] Adduct of 2,4-diamino-6-methacryloyloxyethyl-S-triazine with isocyanuric acid It is clearly noted from Table 2 that the liquid solder resist compositions of Examples 4 to 7 according to the present invention excelled in one-package stability and the cured films of the compositions excelled in resistance to the heat of soldering, fastness of adhesion, resistance to electroless gold plating, resistance to electrolytic corrosion, and electrical insulating property. In contrast, the liquid solder resist compositions of Comparative Examples 5 and 6 containing dicyandiamide or 2-methyl imidazole as a curing promoter in the place of a vinyltriazine compound afforded cured films which were deficient in resistance to the heat of soldering and resistance to electroless gold plating. The liquid solder resist composition containing a vinyltriazine compound and not incorporating an inorganic filler which was obtained in Comparative Example 7 afforded a cured film which was deficient in resistance to the heat of soldering and resistance to electroless gold plating.

TABLE 3

(in parts by weight)

| | Examples | | | Comparative |
|---|---|---|---|---|
| Example No. | 8 | 9 | 10 | Example 8 |
| Varnish a | 154 | — | — | — |
| Varnish b | — | 154 | — | — |
| Varnish c | — | — | 154 | — |
| Varnish d | — | — | — | 154 |
| Irgacure 907 | 10 | 10 | 10 | 10 |
| TMPTA | 60 | 30 | 20 | 20 |
| Phthalocyanine green | 1 | 1 | 1 | 1 |
| Barium sulfate | 200 | 200 | 200 | 200 |
| Talc | 100 | 100 | 100 | 100 |
| Phenol novolak epoxy acrylate | 80 | 20 | 10 | 10 |
| Carbitol acetate | 30 | 50 | 20 | 50 |
| Vinyltriazine | 2 | 2 | 2 | 2 |
| One-package stability | ○ | ○ | ○ | ○ |
| Resistance to the heat of soldering | ◉ | ◉ | ○ | ○ |
| Fastness of adhesion | ○ | ○ | ○ | ○ |
| Resistance to electroless gold plating | ○ | ○ | ○ | ○ |
| Resistance to electrolytic corrosion | ○ | ○ | ○ | △ |

TABLE 3-continued (in parts by weight)

|  | Examples | | | Comparative |
|---|---|---|---|---|
| Example No. | 8 | 9 | 10 | Example 8 |
| Electrical insulating property | $10^{13}$ Ω | $10^{13}$ Ω | $10^{13}$ Ω | $10^{12}$ Ω |

It is clearly noted from Table 3 that even the liquid solder resist composition containing a photosensitive resin obtained by addition of an acid anhydride to the epoxy acrylate of a cresol novolak type epoxy resin (Comparative Example 8), when cured by heating subsequently to the steps of exposure and development, afforded a cured film which excelled in resistance to the heat of soldering, fastness of adhesion, and resistance to electroless gold plating. In contrast, the liquid solder resist compositions of Examples 8 to 10 according to the present invention excelled in one-package stability. Since these compositions contained a phenol novolak epoxy acrylate, which is a polyfunctional unsaturated group-containing compound assuming a solid or semisolid state at normal room temperature, the cured films produced by thermally curing the compositions subsequently to the steps of exposure and development excelled in resistance to the heat of soldering, fastness of adhesion, resistance to electroless gold plating, resistance to electrolytic corrosion, and electrical insulating property. Example 11:

The photocurable resin compositions shown in Table 4 were obtained by following the procedure of the examples mentioned above while using varnish b' obtained in Synthetic Example 3 instead and changing the amount of the inorganic filler to be incorporated. The characteristics of the compositions are shown additionally in Table 4.

The properties other than those shown in Tables 1 to 3 were tested by the following methods.

Test for finger-touch dryness

Samples of the compositions shown in Table 4 were each applied by screen printing to the entire surface of a copper-clad substrate having a prescribed pattern preparatorily formed thereon. The substrates bearing applied layers of samples were placed in a box type oven with internal hot-air circulation and dried at 90° C. for 5 to 20 minutes. The dried layers were tested for finger-touch dryness. The results of the test were rated on the following three-point scale.

○: Absolutely no tuck observed

Δ: Only slight tuck observed x: Conspicuous tuck observed

Test for sensitivity

Samples of the compositions shown in Table 4 were each applied by screen printing to the entire surface of a copper-clad substrate having a prescribed pattern preparatorily formed thereon. The applied layers of composition were each dried at 90° C. for 10 minutes, covered directly with a negative film, exposed to an ultraviolet light from a metal halide lamp at a cumulative dose of 70 mJ/cm², and developed with an aqueous sodium carbonate solution under a spray pressure of 2 kg/cm². The films consequently formed on the copper foils were examined to determine the number of step tablets of glossy resist remaining thereon.

To prepare test substrates for evaluation of other characteristics of the sample compositions, after the development, the sample compositions on the substrates were each finally cured in a UV conveyor furnace by exposure to an ultraviolet light at a cumulative dose of 1000 mJ/cm². The obtained test substrates were each used for evaluation of resistance to the heat of soldering and resistance to electroless gold plating mentioned above.

TABLE 4

(in parts by weight)

| No. | 1 | 2 | 3 | 4 |
|---|---|---|---|---|
| Varnish b' | 154 | 154 | 154 | 154 |
| Irgacure 369[1] | 8 | 8 | 8 | 8 |
| TMPTA | 50 | 50 | 50 | 50 |
| Phthalocyanine green | 1 | 1 | 1 | 1 |
| Barium sulfate | 200 | 100 | 100 | 0 |
| Talc | 100 | 70 | 30 | 0 |
| Phenol novolak epoxy acrylate | 20 | 20 | 20 | 20 |
| Carbitol acetate | 40 | 40 | 40 | 40 |
| MAVT[3] | 2 | 2 | 2 | 2 |
| Finger-touch dryness | | | | |
| 5 minutes | ○ | Δ | x | x |
| 10 minutes | ○ | ○ | Δ | x |
| 15 minutes | ○ | ○ | Δ | x |
| 20 minutes | ○ | ○ | ○ | Δ |
| Sensitivity | 6 steps | 5 steps | 4 steps | 3 steps |
| Resistance to the heat of soldering | ⊚ | ⊚ | ○ | x |
| Resistance to electroless gold plating | ○ | ○ | Δ | x |

Remark
[1] 2-Benzyl-2-dimethylamino-1-(morpholino-phenyl)-butanone-1 (photopolymerization initiator produced by Ciba Geigy)

While certain specific working examples have been disclosed herein, the invention may be embodied in other specific forms without departing from the spirit or essential characteristics thereof. The described examples are therefore to be considered in all respects as illustrative and not restrictive, the scope Of the invention being indicated by the appended claims rather than by the foregoing description and all changes which come within the meaning and range of equivalency of the claims are, therefore, intended to be embraced therein.

What is claimed is:

1. A one-package photosolder resist composition developable with an aqueous alkali solution, comprising:

(A) a copolymeric macromolecular compound having at least one free carboxyl group in its molecule, the macromolecular compound being a copolymer of an unsaturated monobasic acid and at least one unsaturated compound having one unsaturated group in its molecule, said unsaturated monobasic acid being selected from the group consisting of acrylic acid, methacrylic acid, adducts of unsaturated dibasic acid anhydride with hydroxyl group-containing acrylates or methacrylates, and adducts of caprolactone with acrylic acid or methacrylic acid, and said unsaturated compound being selected from the group consisting of vinyl compounds, alkyl acrylates, alkyl methacrylates, acrylic esters, methacrylic esters, and maleimides, (B) a diluent including a polyfunctional unsaturated compound which is in a liquid state at normal room temperature and an organic solvent, (C) a photopolymerization initiator, (D) a vinyltriazine compound or a derivative thereof selected from the group consisting of 2-vinyl-4,6- diamino-S-triazine, 2,4-diamino-6-methacryloyloxy-ethyl-S-triazine, adduct of 2-vinyl-4,6-diamino-S-triazine with isocyanuric acid, and adduct of 2,4-diamino-6-methacryloyloxy-ethyl-S-triazine with isocyanuric acid, and (E) an inorganic filler, the filler being present in an amount of 150 to 600 parts by weight, based on 100 parts by weight of said copolymeric macromolecular compound (A).

2. The composition according to claim 1, wherein said copolymeric macromolecular compound (A) is a carboxyl group-containing resin of a molecular weight in the range of 5,000 to 60,000.

3. The composition according to claim 1, wherein said copolymeric macromolecular compound (A) has an acid value in the range of 30 to 200 mg KOH/g.

4. The composition according to claim 1, wherein said dibasic acid anhydride is selected from the group consisting of phthalic anhydride, methyltetrahydrophthalic anhydride, tetrahydrophthalic anhydride, hexahydrophthalic anhydride, methylhexahydrophthalic anhydride, succinic anhydride, maleic anhydride, itaconic anhydride, and nadic anhydride.

5. The composition according to claim 1, wherein said vinyltriazine compound or derivative thereof is present in an amount of 0.1 to 10 parts by weight, based on 100 parts by weight of said copolymeric macromolecular compound (A).

6. The composition according to claim 1, wherein said polyfunctional unsaturated compound which is in a liquid state at normal room temperature is selected from the group consisting of hydroxyl group-containing acrylates, hydroxyl group-containing methacrylates, acrylamides, methacrylamides, water-soluble acrylates, water-soluble methacrylates, polyfunctional acrylates, and polyfunctional methacrylates and present in an amount of 5 to 100 parts by weight, based on 100 parts by weight of said copolymeric macromolecular compound (A).

7. The composition according to claim 1, wherein said organic solvent is selected from the group consisting of ketones, cellosolves, carbitols, cellosolve acetates, carbitol acetates, propylene glycol ethers, dipropylene glycol ethers, propylene glycol ether acetates, dipropylene glycol ether acetates, and aromatic hydrocarbons and present in an amount of 5 to 300 parts by weight, based on 100 parts by weight of said copolymeric macromolecular compound (A).

8. The composition according to claim 1, wherein said photopolymerization initiator is selected from the group consisting of benzoin, alkyl ethers of benzoin, acetophenones, aminoacetophenones, anthraquinones, xanthones, thioxanthones, ketals, benzophenones, and 2,4,6-trimethylbenzoyl diphenyl phosphine oxide and present in an amount of 0.5 to 20 parts by weight, based on 100 parts by weight of said macromolecular compound (A).

9. The composition according to claim 1, which further comprises a polyfunctional unsaturated group-containing compound which is in a solid or semisolid state at normal room temperature.

10. The composition according to claim 1, which further comprises a color pigment, a thixotropic agent, an anti-foaming agent, or a leveling agent.

11. In a method for the production of a printed circuit board, a process of forming a solder resist in a prescribed pattern on a printed circuit board having a circuit preparatorily formed thereon, which process comprises the steps of:
applying to a surface of said printed circuit board having a circuit already formed thereon a one-package photo-solder resist composition set forth in claim 1,
drying the applied layer of said composition,
selectively irradiating the dried layer according to a prescribed pattern,
developing the unirradiated area of said layer with an aqueous alkali solution thereby forming a solder resist pattern, and
finally curing said resist pattern by irradiation.

12. The process according to claim 11, wherein said aqueous alkali solution contains at least one alkali selected from the group consisting of potassium hydroxide, sodium hydroxide, sodium carbonate, potassium carbonate, sodium phosphate, sodium silicate, ammonia, and amines.

13. A one-package photosolder resist composition developable with an aqueous alkali solution, comprising:

(A') a copolymeric macromolecular compound which has at least one free carboxyl group and at least one photoreactive unsaturated group in its molecule and which is in a solid state at normal room temperature, said macromolecular compound (A') being a carboxyl group-containing photosensitive resin obtained by an addition reaction between (1) a copolymer of (1-1) an unsaturated monobasic acid and (1-2) at least one unsaturated compound having one unsaturated group in its molecule and (2) an unsaturated epoxy compound having one epoxy group and one unsaturated group together in its molecule, said copolymer (1) having a molecular weight in the range of 5,000 to 60,000, (B) a diluent selected from the group consisting of a polyfunctional unsaturated compound which is in a liquid state at normal room temperature, an organic solvent, and a mixture thereof, (C) a photopolymerization initiator, (D) a vinyltriazine compound or a derivative thereof selected from the group consisting of 2-vinyl-4,6-diamino-S-triazine, 2,4-diamino-6-methacryloyloxy-ethyl-S-triazine, adduct of 2-vinyl-4,6-diamino-S-triazine with isocyanuric acid, and adduct of 2,4-diamino-6-methacryloyloxy-ethyl-S-triazine with isocyanuric acid, and E) an inorganic filler, the filler being present in an amount of 150 to 600 parts by weight, based on 100 parts by weight of said copolymeric macromolecular compound A).

14. The composition according to claim 13, wherein said copolymeric macromolecular compound (A') has an acid value in the range of 30 to 200 mg KOH/g.

15. The composition according to claim 13, wherein said unsaturated monobasic acid is selected from the group consisting of acrylic acid, methacrylic acid, adducts of unsaturated dibasic acid anhydride with hydroxyl group-containing acrylates or methacrylates, and adducts of caprolactone with acrylic acid or methacrylic acid.

16. The composition according to claim 15, wherein said dibasic acid anhydride is selected from the group consisting of phthalic anhydride, methyltetrahydrophthalic anhydride, tetrahydrophthalic anhydride, hexahydrophthalic anhydride, methylhexahydrophthalic anhydride, succinic anhydride, maleic anhydride, itaconic anhydride, and nadic anhydride.

17. The composition according to claim 13, wherein said unsaturated compound (1-1) is selected from the group consisting of vinyl compounds, alkyl acrylates, alkyl methacrylates, acrylic esters, methacrylic esters, and maleimides.

18. The composition according to claim 13, wherein said unsaturated epoxy compound (2) is selected from the group consisting of glycidyl acrylates, glycidyl methacrylates, N-[4-(2,3-epoxypropoxy)-3,5S-dimethylbenzyl]

acrylamide, aryl glycidyl ethers, and acrylic or methacrylic monomers having an alicyclic epoxy group.

19. The composition according to claim 13, wherein said vinyltriazine compound or derivative thereof is present in an amount of 0.1 to 10 parts by weight, based on 100 parts by weight of said copolymeric macromolecular compound (A').

20. The composition according to claim 13, wherein said polyfunctional unsaturated compound which is in liquid state at normal room temperature is selected from the group consisting of hydroxyl group-containing acrylates, hydroxyl group-containing methacrylates, acrylamides, methacrylamides, water-soluble acrylates, water-soluble methacrylates, polyfunctional acrylates, and polyfunctional methacrylates and present in an amount of 5 to 100 parts by weight, based on 100 parts by weight of said copolymeric macromolecular compound (A').

21. The composition according to claim 13, wherein said organic solvent is selected from the group consisting of ketones, cellosolves, carbitols, cellosolve acetates, carbitol acetates, propylene glycol ethers, dipropylene glycol ethers, propylene glycol ether acetates, dipropylene glycol ether acetates, and aromatic hydrocarbons and present in an amount of 5 to 300 parts by weight, based on 100 parts by weight of said copolymeric macromolecular compound (A').

22. The composition according to claim 13, wherein said photopolymerization initiator is selected from the group consisting of benzoin, alkyl ethers of benzoin, acetophenones, aminoacetophenones, anthraquinones, xanthones, thioxanthones, ketals, benzophenones, and 2,4,6-trimethylbenzoyl diphenyl phosphine oxide and present in an amount of 0.5 to 20 parts by weight, based on 100 parts by weight of said macromolecular compound (A').

23. The composition according to claim 13, which further comprises a polyfunctional, unsaturated group-containing compound which is in a solid or semisolid state at normal room temperature.

24. The composition according to claim 13, which further comprises a color pigment, a thixotropic agent, an antifoaming agent, or a leveling agent.

25. In a method for the production of a printed circuit board, a process of forming a solder resist in a prescribed pattern on a printed circuit board having a circuit preparatorily formed thereon, which process comprises the steps of:

applying to a surface of said printed circuit board having a circuit already formed thereon a one-package photosolder resist composition set forth in claim 13, drying the applied layer of said composition, selectively irradiating the dried layer according to a prescribed pattern, developing the unirradiated area of said layer with an aqueous alkali solution thereby forming a solder resist pattern, and finally curing said resist pattern by irradiation.

26. The process according to claim 25, wherein said aqueous alkali solution contains at least one alkali selected from the group consisting of potassium hydroxide, sodium hydroxide, sodium carbonate, potassium carbonate, sodium phosphate, sodium silicate, ammonia, and amines.

27. A one-package photosolder resist composition developable with an aqueous alkali solution, comprising:

(A') a copolymeric macromolecular compound which has at least one free carboxyl group and at least one photoreactive unsaturated group in its molecule and which is in a solid state at normal room temperature, said macromolecular compound (A') being a carboxyl group-containing photosensitive resin obtained by an addition reaction between (1) a dibasic acid anhydride and (2) a reaction product of (2-1) an unsaturated monobasic acid with (2-2) a copolymer of (2-2-1) an unsaturated epoxy compound having one epoxy group and one unsaturated group together in its molecule and (2-2-2) at least one unsaturated compound having one unsaturated group in its molecule, said copolymer (2-2) having a molecular weight in the range of 5,000 to 60,000, (B) a diluent selected from the group consisting of a polyfunctional unsaturated compound which is in a liquid state at normal room temperature, an organic solvent, and a mixture thereof, (C) a photopolymerization initiator, (D) a vinyltriazine compound or a derivative thereof selected from the group consisting of 2-vinyl-4,6-diamino-S-triazine, 2,4-diamino-6-methacryloyloxy-ethyl-S-triazine, adduct of 2-vinyl-4,6-diamino-S-triazine with isocyanuric acid, and adduct of 2,4-diamino-6-methacryloyloxy-ethyl-S-triazine with isocyanuric acid, and (E) an inorganic filler, the filler being present in an amount of 150 to 600 parts by weight, based on 100 parts by weight of said copolymeric macromolecular compound (A').

28. The composition according to claim 27, wherein said copolymeric macromolecular compound (A') has an acid value in the range of 30 to 200 mg KOH/g.

29. The composition according to claim 27, wherein said dibasic acid anhydride (1) is selected from the group consisting of phthalic anhydride, methyltetrahydrophthalic anhydride, tetrahydrophthalic anhydride, hexahydrophthalic anhydride, methylhexahydrophthalic anhydride, succinic anhydride, maleic anhydride, itaconic anhydride, and nadic anhydride.

30. The composition according to claim 27, wherein said unsaturated monobasic acid (2-1) is selected from the group consisting of acrylic acid, methacrylic acid, adducts of unsaturated dibasic acid anhydride with hydroxyl group containing acrylates or methacrylates, and adducts of caprolactone with acrylic acid or methacrylic acid.

31. The composition according to claim 27, wherein said unsaturated epoxy compound (2-2-1) is selected from the group consisting of glycidyl acrylates, glycidyl methacrylates, N-[4(2, 3-epoxypropoxy)-3,5-dimethylbenzyl] acrylamide, aryl glycidyl ethers, and acrylic or methacrylic monomers having an alicyclic epoxy group.

32. The composition according to claim 27, wherein said unsaturated compound (2-2-2) is selected from the group consisting of vinyl compounds, alkyl acrylates, alkyl methacrylates, acrylic esters, methacrylic esters, and maleimides.

33. The composition according to claim 27, wherein said vinyltriazine compound or derivative thereof (D) is present in an amount of 0.1 to 10 parts by weight, based on 100 parts by weight of said copolymeric macromolecular compound (A').

34. The composition according to claim 27, wherein said polyfunctional unsaturated compound which is in a liquid state at normal room temperature is selected from the group consisting of hydroxyl group-containing acrylates, hydroxyl group-containing methacrylates, acrylamides, methacrylamides, water-soluble acrylates, water-soluble methacrylates, polyfunctional acrylates, and polyfunctional methacrylates and present in an amount of 5 to 100 parts by weight, based on 100 parts by weight of said copolymeric macromolecular compound (A').

35. The composition according to claim 27, wherein said organic solvent is selected from the group consisting of ketones, cellosolves, carbitols, cellosolve acetates, carbitol acetates, propylene glycol ethers, dipropylene glycol ethers, propylene glycol ether acetates, dipropylene glycol ether acetates, and aromatic hydrocarbons and present in an amount of 5 to 300 parts by weight, based on 100 parts by weight of said copolymeric macromolecular compound (A').

36. The composition according to claim 27, wherein said photopolymerization initiator (C) is selected from the group consisting of benzoin, alkyl ethers of benzoin, acetophenones, aminoacetophenones, anthraquinones, xanthones, thioxanthones, ketals, benzophenones, and 2,4,6-trimethylbenzoyl diphenyl phosphine oxide and present in an amount of 0.5 to 20 parts by weight, based on 100 parts by weight of said macromolecular compound (A').

37. The composition according to claim 27, which further comprises a polyfunctional unsaturated group-containing compound which is in a solid or semisolid state at normal room temperature.

38. The composition according to claim 27, which further comprises a color pigment, a thixotropic agent, an antifoaming agent, or a leveling agent.

39. In a method for the production of a printed circuit board, a process of forming a solder resist in a prescribed pattern on a printed circuit board having a circuit preparatorily formed thereon, which process comprises the steps of:

applying to a surface of said printed circuit board having a circuit already formed thereon a one-package photo-solder resist composition set forth in claim 27, drying the applied layer of said composition, selectively irradiating the dried layer according to a prescribed pattern, developing the unirradiated area of said layer with an aqueous alkali solution thereby forming a solder resist pattern, and finally curing said resist pattern by irradiation.

40. The process according to claim 39, wherein said aqueous alkali solution contains at least one compound selected from the group consisting of potassium hydroxide, sodium hydroxide, sodium carbonate, potassium carbonate, sodium phosphate, sodium silicate, ammonia, and amines.

* * * * *